United States Patent
Koste et al.

(10) Patent No.: US 7,123,015 B2
(45) Date of Patent: Oct. 17, 2006

(54) MAGNETIC RESONANCE SYSTEM AND METHOD

(75) Inventors: Glen Peter Koste, Niskayuna, NY (US); Ronald Dean Watkins, Niskayuna, NY (US); Richard Louis Frey, Delanson, NY (US); Matthew Christian Nielsen, Scotia, NY (US); Joseph Alfred Iannotti, Glenville, NY (US); Todd Ryan Tolliver, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 57 days.

(21) Appl. No.: 10/953,924

(22) Filed: Sep. 29, 2004

(65) Prior Publication Data

US 2006/0066311 A1    Mar. 30, 2006

(51) Int. Cl.
    *G01V 3/00* (2006.01)
(52) U.S. Cl. ..................... 324/322; 324/318
(58) Field of Classification Search ............... 324/322, 324/318, 319, 309, 307, 300; 600/407, 410, 600/422
    See application file for complete search history.

(56) References Cited

U.S. PATENT DOCUMENTS

| | | | |
|---|---|---|---|
| 4,737,712 A * | 4/1988 | Stormont et al. ............ 324/307 |
| 5,384,536 A | 1/1995 | Murakami et al. |
| 5,453,866 A * | 9/1995 | Gross .......................... 398/110 |
| 5,545,999 A * | 8/1996 | Mueller et al. ............. 324/322 |
| 5,692,507 A * | 12/1997 | Seppi et al. ................. 600/407 |
| 6,064,205 A * | 5/2000 | Zhou et al. .................. 324/309 |
| 6,198,287 B1 * | 3/2001 | Heiserholt et al. .......... 324/322 |
| 6,704,592 B1 | 3/2004 | Reynolds et al. |
| 2004/0019273 A1 | 1/2004 | Helfer et al. |

FOREIGN PATENT DOCUMENTS

WO    WO 2002/086526    10/2002
WO    WO 2004/011059    4/2004

* cited by examiner

*Primary Examiner*—Brij B. Shrivastav
(74) *Attorney, Agent, or Firm*—Ann M. Agosti; Patrick K. Patnode

(57) ABSTRACT

A magnetic resonance (MR) system and method for generating information about an object is provided. The MR system comprises at least one MR detector configured to sense a plurality of electromagnetic signals and a modulator coupled to the MR detector and configured to modulate optical signals with the electromagnetic signals to generate corresponding modulated optical signals. The MR system further comprises a resonant matching circuit configured for matching an impedance of the MR detector to an impedance of the modulator to achieve at least one of a voltage gain or a noise performance. An optical conduit coupled to the modulator is configured to transmit the modulated optical signals from within a shielded environment to outside the shielded environment. A signal detector coupled to the optical conduit is configured to convert the modulated optical signals to electrical signals.

31 Claims, 3 Drawing Sheets

MAGNETIC RESONANCE SYSTEM AND METHOD

BACKGROUND

The invention relates generally to imaging and spectroscopy systems and more specifically to magnetic resonance systems and methods.

High field magnetic systems such as magnetic resonance imaging (MRI) systems are typically located inside a shielded environment such as a shielded room. Several MR detectors are used as sensing elements in MRI systems and are used for sensing and transmitting electromagnetic signals. Computer processors are used for processing the electromagnetic signals to generate a corresponding image of an object.

Typically, the computer processors of MRI systems are located outside the shielded room. Coaxial cables are usually used to connect circuits within the shielded room to circuits outside of the shielded room. Isolating the signals propagated through the cables from outside the shielded room to the inside of the shielded room is a major challenge in such applications and is performed in general, to prevent radio frequency interference from degrading image acquisition and processing.

To increase the quality of the images, MRI systems sometimes comprise several magnetic resonance (MR) detectors. Examples of MR detectors include receive coils. One problem when increasing the number of coils is the corresponding increase in the coaxial cable required to connect the coils to the computer processor. Increasing the number of coaxial cables results in various problems such as bulky cables connectors, electro magnetic interference and crosstalk. Another problem with the conductive coaxial cables that connect the MR detector or RF coil to the system is that the conductive cables can form loops, which in turn can induce local heating during-high energy transmit pulses used in MRI which may be a safety concern.

Therefore, there is a need to transmit signals with high fidelity between the MR detectors in the shielded room and a computer processor located outside the shielded room.

BRIEF DESCRIPTION

Briefly, according to one aspect of the invention, a method for generating information of an object using a magnetic resonance system is provided. The method comprises sensing a plurality of electromagnetic signals using a sensing element and matching an impedance of the sensing element to an impedance of a modulator to a voltage gain or a noise performance. The method further comprises modulating optical signals with the electromagnetic signals to generate corresponding modulated optical signals using the modulator and transmitting the modulated optical signals using an optical conduit from within a shielded environment to outside the shielded environment. The modulated optical signals are then converted to digital electrical signals.

In another embodiment, a magnetic resonance (NM) system for generating an image of an object is provided. The MR system comprises at least one MR detector configured to sense a plurality of electromagnetic signals and a resonant matching circuit configured for matching an impedance of the MR detector to an impedance of the modulator to achieve at least one of a voltage gain or a noise performance. The MR system further comprises a modulator coupled to the MR detector and configured to modulate optical signals with the electromagnetic signals to generate corresponding modulated optical signals. An optical conduit is coupled to the modulator and configured to transmit the modulated optical signals from within a shielded environment to outside the shielded environment. The MR system further comprises a signal detector coupled to the optical conduit and configured to convert the modulated optical signals to electrical signals.

In another embodiment, a method for obtaining signals representative of an image of an object using a magnetic resonance (MR) system is provided. The method comprises transmitting power from outside a shielded environment using a transmission element and providing electrical power to a plurality of electronic devices located inside the shielded environment. The method further comprises sensing electromagnetic signals using an MR detector and at least one of the plurality of electronic circuits and generating optical MR signals representative of the electromagnetic signals. The method also comprises transmitting the optical MR signals using an optical conduit from within the shielded environment to outside the shielded environment.

In another embodiment, a magnetic resonance (MR) system for generating an image of an object is provided. The MR system comprises at least one MR detector located inside a shielded environment and configured to sense a plurality of electromagnetic signals and a plurality of electronic devices coupled to the MR detector. The MR system further comrpises at least one optical conduit configured to transmit optical MR signals from inside the shielded environment to outside the shielded environment, the optical MR signals representing the electromagnetic signals. The one optical conduit is further configured to transmit optical power from outside the shielded environment to inside the shielded environment. The MR System further comprises an optical to electrical power conversion device for converting the optical power signals into electrical power for use by at least one of the electronic devices.

In another embodiment, a magnetic resonance (MR) system for generating an image of an object is provided. The MR system comprises at least one MR detector configured to sense a plurality of electromagnetic signals. The MR system further comprises a modulator coupled to the MR detector and configured to modulate optical signals with the electromagnetic signals to generate corresponding modulated optical signals. A first optical conduit is coupled to the modulator and is configured to transmit the modulated optical signals from within a shielded environment to outside the shielded environment. The MR system further comprises a signal detector coupled to the optical conduit and configured to convert the modulated optical signals to electrical signals and a processor configured to linearize the modulated signals and to process the electrical signals to generate the image of the object.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
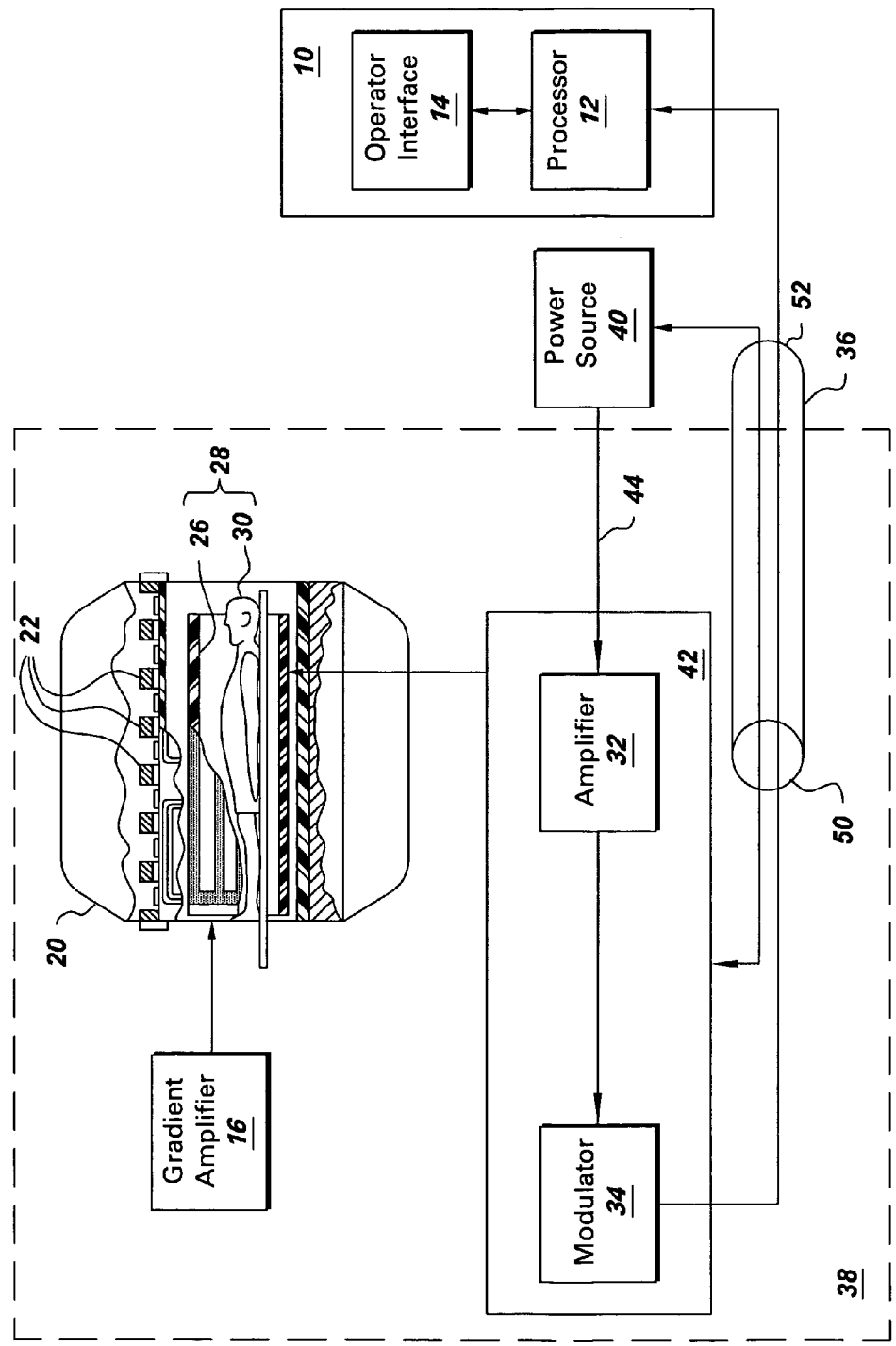
FIG. 1 is a block diagram illustrating one embodiment of a magnetic resonance imaging system implemented according to one aspect of the invention.

FIG. 1 is a block diagram of an exemplary embodiment of a high field magnetic resonance imaging (MRI) system, which may be used in accordance with aspects of the invention. Other magnetic resonance systems such as magnetic resonance spectroscopy systems, which can be used to analyze material properties may also benefit from the present techniques. The following discussion of an MRI system is merely an example of one such implementation and is not intended to be limiting in terms of modality or anatomy.

As used herein, the term "high field" refers to magnetic fields produced by the MRI system that are greater than about 1 Tesla. Each component is described in further detail below.

As used herein, "adapted to", "configured" and the like refer to devices in a system to allow the elements of the system to cooperate to provide a described effect; these terms also refer to operation capabilities of electrical or optical elements such as analog or digital computers or application specific devices (such as an application specific integrated circuit (ASIC)), amplifiers or the like that are programmed to provide an output in response to given input signals, and to mechanical devices for optically or electrically coupling components together.

The operation of the MR system is controlled from an operator console 10, which includes a keyboard, a control panel and a display (not shown). The console 10 communicates with a processor 12 via operator console 14 that enables an operator to control the production and display of images. The processor includes a number of modules, which communicate with each other through a backplane. These include an image processor module, a CPU module, a pulse generator module, and a memory module, known in the art as a frame buffer for storing image data arrays. The processor 12 is typically linked to a disk storage and a tape drive (not shown) for storage of image data and programs, and it communicates with a separate system control (not shown) through a high speed serial link.

The pulse generator module connects to the operator console through a serial link. The system control receives commands from the operator, which indicate the scan sequence that is to be performed. The pulse generator module operates the system components to carry out the desired scan sequence. It produces data that indicate the timing, strength, and shape of the radio frequency (RF) pulses, which are to be produced, and the timing of and length of the data acquisition window. The pulse generator module connects to a set of gradient amplifiers 16 to indicate the timing and shape of the gradient pulses to be produced during the scan.

The gradient waveforms produced by the pulse generator module are applied to a gradient amplifier system 16 comprising of Gx, Gy and Gz amplifiers (not shown). Each gradient amplifier excites a corresponding gradient coil in an assembly generally designated 18 to produce the magnetic field gradients used for position encoding acquired signals. The gradient coil assembly 18 forms part of a magnet assembly 20, which includes a polarizing magnet 22, and a whole-body receive coil 26. In the illustrated embodiment, the receive-coil is a radio frequency coil. Volume 28 is shown as the area within magnet assembly 20 for receiving subject 30 and includes a patient bore. As used herein, the usable volume of a MRI scanner is defined generally as the volume within volume 28 that is a contiguous area inside the patient bore where homogeneity of main, gradient and RF fields are within known, acceptable ranges for imaging.

In the illustrated embodiment, system control generally includes a transmitter module that is adapted to produce pulses that are provided to receive coil 26. Receive coil 26 is configured to sense a plurality of electromagnetic signals. The electromagnetic signals are amplified by amplifier 32. The amplified signals are modulated by modulator 34 and are provided to the processor using optical conduit 36.

The MR signals are transferred to a memory module in the system control. When the scan is completed and an entire array of data has been acquired in the memory module. A processor (not shown) operates to Fourier transform the data into an array of image data. These image data are conveyed to the processor 12 where they are stored. In response to commands received from the operator console 10, these image data may be further processed by an image processor within processor 12 and conveyed to the operator console 10 and subsequently displayed.

As illustrated in FIG. 1, gradient amplifier 16, the magnet assembly 20, and amplifier 32 are located within shielded room 38. The system control, processor and operator console are located outside the shielded room. The MR signals are transmitted to the system control using optical conduit 36. As used herein "optical conduit" means one or more optical mediums such as optical fibers or waveguides, for example. Electronic devices 42 include devices such as amplifier 32 and modulator 34.

FIG. 1 further shows a power source 40 located outside the shielded room 38 and used for generating electrical power. Electrical power or optical power is transmitted to the electronic devices 42 located inside the shielded room via transmission element 44. Examples of transmission element include (but is not limited to) optical fibers, co-axial cables, and highly resistive wires.

As described earlier, the electromagnetic signals detected within the shielded room are transmitted to a processor outside the shielded room using optical conduit 36. The manner in which the optical conduit is used to transmit signals is described in further detail with reference to FIG. 2.

Figure 2:
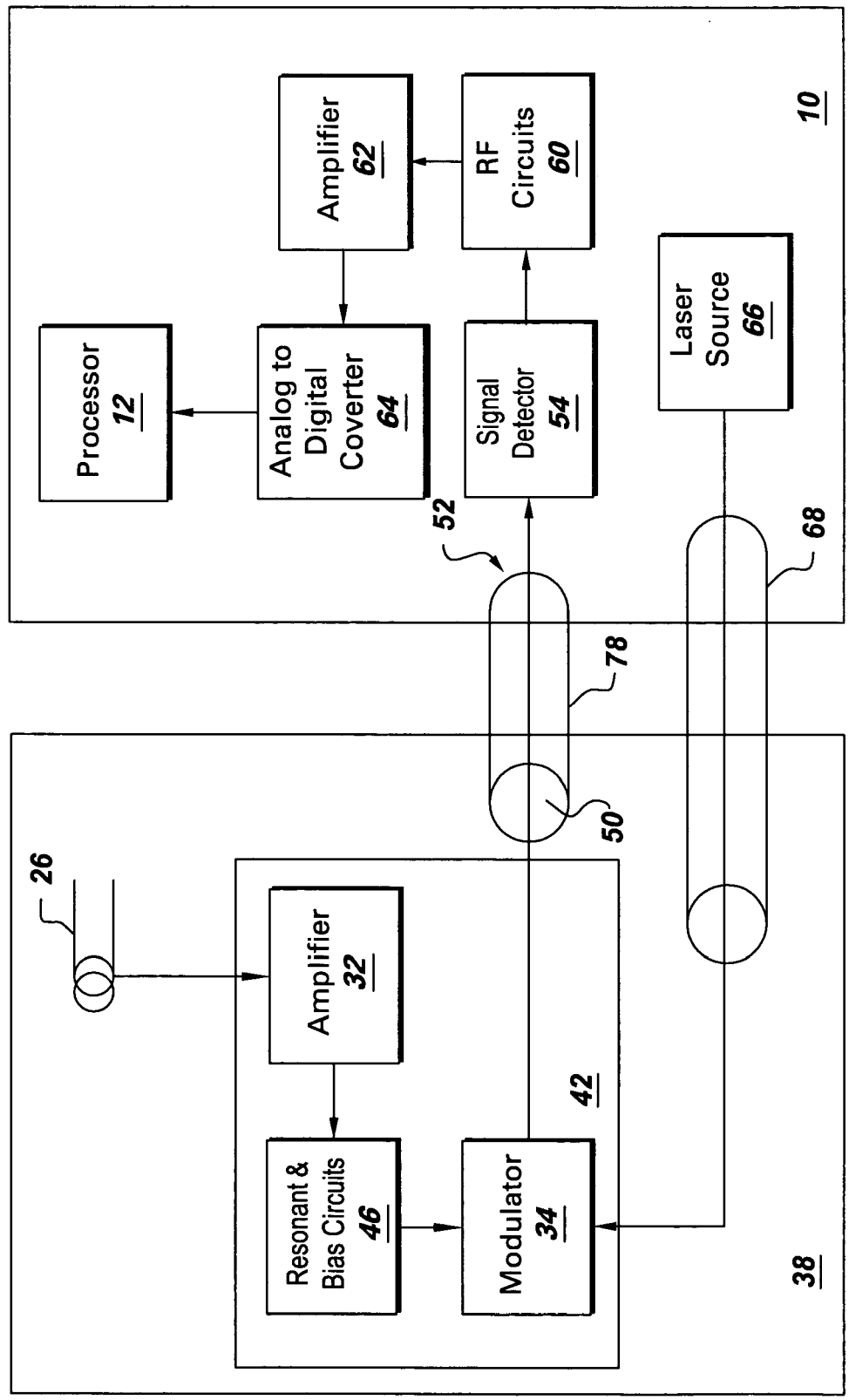
FIG. 2 is a block diagram illustrating a manner by which an optical conduit is used to transmit signals from inside the shielded room to outside the shielded room.

FIG. 2 is a block diagram illustrating one example embodiment in which the optical conduit is coupled from devices inside the shielded room to the devices outside the shielded room. Each component is described in detail below.

As described with reference to FIG. 1, receive coil 26 is configured to sense electromagnetic signals. The electromagnetic signals carry spatial information or frequency information that can be used to construct images of subject 30. In the illustrated embodiment, the receive coil is a radio frequency (RF) coil. Amplifier 32 amplifies the electromagnetic signals received from the receive coil. In one embodiment, the amplifier is a low noise, low impedance amplifier.

Resonant matching and bias circuit 46 is adapted to match the low noise amplifier impedance to the impedance of the modulator 34. The matching circuit increases the voltage of the signals from the low noise amplifier before applying the voltage to the modulator 34. Since the magnitude of the optical modulation is a function of the voltage and not the power of the applied electrical signal, the use of a passive matching circuit provides signal gain with no additional electrical power.

Modulator 34 receives analog signals from the resonant matching circuit 46 and is adapted to modulate optical signals with the analog signals to generate corresponding modulated signals. In one embodiment, the optical signals are provided to the modulator by laser source 66. Optical conduit 36 can be used to transmit the optical signals from the laser source to the modulator. The modulated signals are transmitted to a console 10 outside the shielded room using optical conduit 36. In the illustrated embodiment, the amplifier, the resonant matching circuits and the modulator are collectively referred to as electronic devices 42.

Optical conduit 36 comprises a first end and 50 and a second end 52. The first end is coupled to modulator 34 located inside the shielded room 38 and the second end 52 is coupled to signal detector 54. In one embodiment, optical conduit comprises optical fibers. It may be noted that, as stated above optical conduit 36 may also be used to transmit the optical signals generated by laser source 66 to modulator 34.

Signal detector 54 is configured to convert the modulated signals to generate the analog electrical signal. The analog electrical signal is provided to matching circuit 56. Radio frequency circuits (RF) 60 remove noise components from the analog electric signals, amplify the signals and provide the signals to analog to digital converter 64. Analog to digital converter (ADC) 64 converts the analog signals to corresponding digital signals. The digital signals are provided to signal processor 12.

Processor 12 performs various operations on the digital signals to generate an image corresponding to the electromagnetic signals by receive coil 26. The processor also performs linearization operations to overcome non-linearity that may have been introduced by modulator 34. One method for linearization is to make use of a lookup table to map the digital signals received from the ADC 64 to linearized signals before image processing. This can be accomplished in the processor 12.

Figure 3:
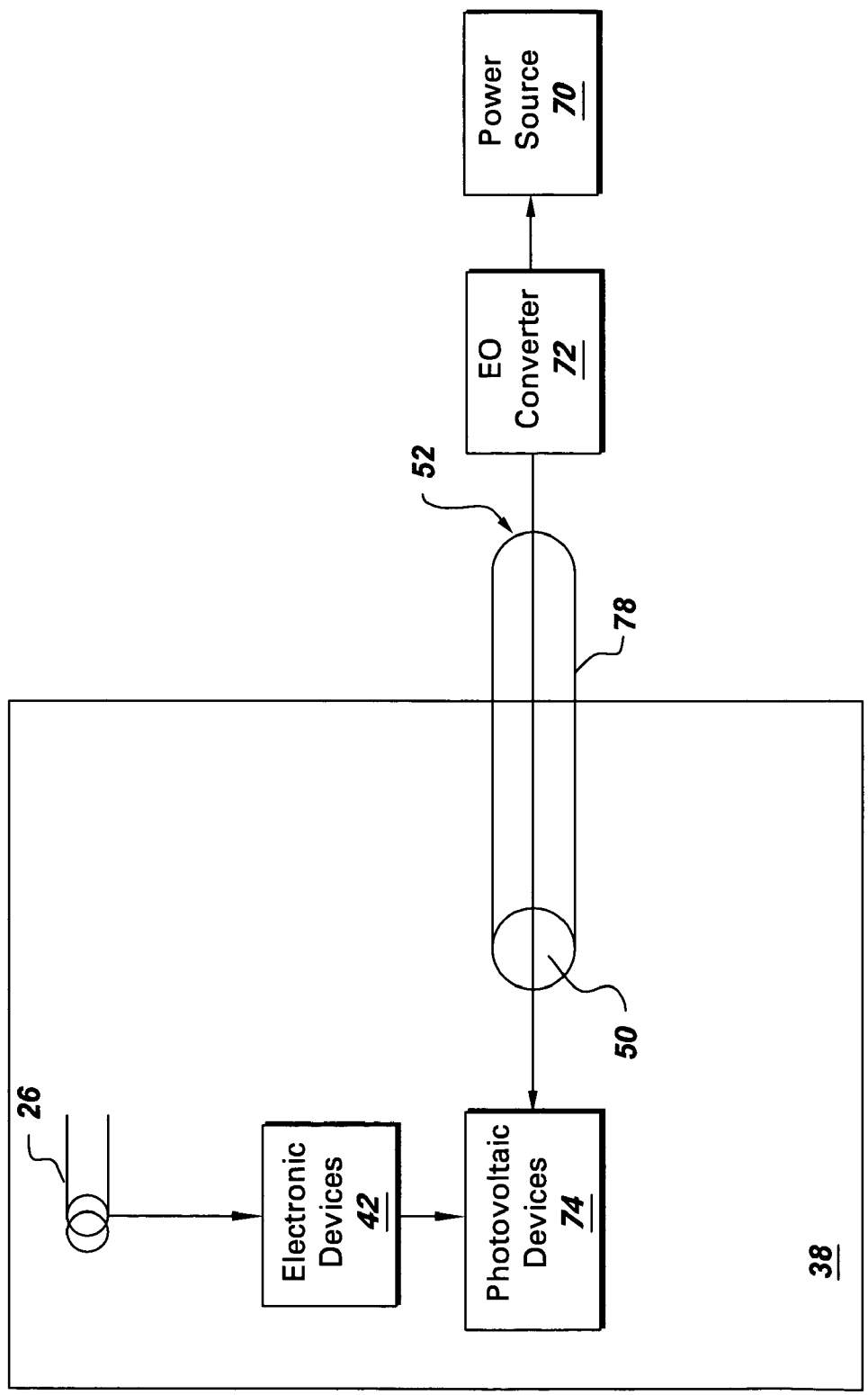
FIG. 3 is a block diagram illustrating a manner by which an optical conduit is used to transmit power signals from outside the shielded room to inside the shielded room.

FIG. 3 is a block diagram illustrating the transmission of power from outside the shielded room according to another aspect of the invention. As described with reference to FIG. 1 and FIG. 2, electronic devices 42 such as amplifier 32 and modulator 34. These electronic devices require electrical power at the receive coil. Power source 70 may be used to provide the electrical power. In the illustrated embodiment, the power source is located outside the shielded room. It may be noted that the power source may be located inside the shielded room as well. Electro-optic converter 72 converts the electrical power to optical power.

In the illustrated embodiment, the optical power is transmitted from outside the shielded room to the electronic devices inside the shielded room using optical conduit 78. Optical conduit 78 transmits the optical power to photovoltaic devices 74 located inside the shielded room 38. The photovoltaic devices convert the optical power to corresponding electrical power. The electrical power is provided to the electronic devices 42 which are coupled to receive coil 26.

The use of the optical conduit eliminates the use bulky coaxial cable connections usually required for MR receive coil arrays. Furthermore, the optical conduit is immune to electromagnetic interference and crosstalk, thus the signals are transmitted with high fidelity. Also, as no electrical connections are used, such systems provide enhanced patient safety.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for generating information about an object using a magnetic resonance system, the method comprising:
    sensing a plurality of electromagnetic signals using a sensing element;
    matching an impedance of the sensing element to an impedance of a modulator to achieve at least one of a voltage gain or a noise performance;
    modulating optical signals with the electromagnetic signals to generate corresponding modulated optical signals using the modulator;
    transmitting the modulated optical signals using an optical conduit from within a shielded environment to outside the shielded environment; and
    converting the modulated optical signals to digital electrical signals.

2. The method of claim 1, further comprising processing the digital electrical signals to generate the information about the object.

3. The method of claim 1, wherein processing further comprises linearizing the signals.

4. The method of claim 1, further comprising transmitting power from outside the shielded environment to a plurality of electronic circuits inside the shielded environment using a transmission element.

5. The method of claim 4, wherein the transmission element is selected from the group consisting optical fiber, co-axial cable, and highly resistive wire.

6. The method of claim 1, further comprising amplifying the electromagnetic signals prior to matching to an impedance of a modulator.

7. The method of claim 1, wherein the optical conduit comprises at least one optical fiber.

8. The method of claim 1, wherein the magnetic system is a magnetic resonance imaging system.

9. The method of claim 1, wherein the magnetic system is a magnetic resonance spectroscopy system.

10. The method of claim 1, further comprising providing the optical signals to the modulator from an optical source.

11. The method of claim 1, wherein the optical source is located outside the shielded environment.

12. The method of claim 1, wherein the optical source is located inside the shielded environment.

13. The method of claim 1, wherein the optical source comprises a laser.

14. An magnetic resonance (MR) system for generating an image of an object, the MR system comprising:
    at least one MR detector configured to sense a plurality of electromagnetic signals;
    a modulator coupled to the MR detector and configured to modulate optical signals with the electromagnetic signals to generate corresponding modulated optical signals;
    a resonant matching circuit coupled between the MR detector and the modulator and configured for matching an impedance of the MR detector to an impedance of the modulator to achieve at least one of a voltage gain or a noise performance;
    an optical conduit coupled to the modulator and configured to transmit the modulated optical signals from within a shielded environment to outside the shielded environment; and a signal detector coupled to the optical conduit and configured to convert the modulated optical signals to electrical signals.

15. The MR system of claim 14, further comprising a processor configured to process the electrical signals to generate the image of the object.

16. The MR system of claim 14, wherein the processor is further configured to linearize the modulated signals.

17. The MR system of claim 14, further comprising a transmission element to transmit power from outside the shielded environment to a plurality of electronic devices located inside the shielded environment.

18. The MR system of claim 17, wherein the power comprises optical power or electrical power.

19. The MR system of claim 14, further comprising photovoltaic devices configured to convert optical power signals from outside the shielded environment to electrical power.

20. The MR system of claim 14, further comprising a laser source configured to transmit the optical signals to the modulator via the optical conduit.

21. The MR system of claim 14, further comprising a low noise amplifier coupled to the MR detector and configured to amplify the electromagnetic signals.

22. The MR system of claim 14, wherein the optical conduit comprises at least one optical fiber.

23. A method for obtaining signals representative of an image of an object using a magnetic resonance system, the method comprising:
   transmitting power from outside a shielded environment using a transmission element;
   providing the power to a plurality of electronic devices located inside the shielded environment;
   sensing electromagnetic signals using an MR detector and at least one of the plurality of electronic circuits;
   generating optical MR signals representative of the electromagnetic signals;
   transmitting the optical MR signals using an optical conduit from within the shielded environment to outside the shielded environment;
   linearizing the digital electrical signals; and
   processing the digital electrical signals to generate the information about the object.

24. The method of claim 23, wherein the power comprises electrical power or optical power.

25. The method of claim 23, wherein the transmission element is selected from the group consisting optical fiber, co-axial cable, and highly resistive wire.

26. The method of claim 25, further comprising storing the converted electricity inside the shielded environment.

27. An magnetic resonance (MR) system for generating an image of an object, the MR system comprising:
   at least one MR detector configured to sense a plurality of electromagnetic signals;
   a modulator coupled to the MR detector and configured to modulate optical signals with the electromagnetic signals to generate corresponding modulated optical signals;
   a first optical conduit coupled to the modulator and configured to transmit the modulated optical signals from within a shielded environment to outside the shielded environment;
   a signal detector coupled to the optical conduit and configured to convert the modulated optical signals to electrical signals; and
   a processor configured to linearize the modulated signals and to process the electrical signals to generate the image of the object.

28. The MR system of claim 27, further comprising a second optical conduit to transmit optical power from outside the shielded environment a plurality of electronic devices located inside the shielded environment.

29. The MR system of claim 28, further comprising photovoltaic devices configured to convert optical power to electrical power.

30. The MR system of claim 27, further comprising a laser source configured to transmit the optical signals to the modulator via the first optical conduit.

31. The MR system of claim 27, further comprising a low noise amplifier coupled to the MR detector and configured to amplify the electromagnetic signals.

* * * * *